United States Patent
Kim et al.

(10) Patent No.: US 6,863,109 B2
(45) Date of Patent: Mar. 8, 2005

(54) IN-LINE DIE ATTACHING AND CURING APPARATUS FOR A MULTI-CHIP PACKAGE

(75) Inventors: Hyun-Ho Kim, Chungcheongnam-do (KR); Young-Kyun Sun, Chungcheongnam-do (KR); Kyoung-Bok Cho, Chungcheongnam-do (KR); Sung-Bok Hong, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/620,745

(22) Filed: Jul. 15, 2003

(65) Prior Publication Data

US 2004/0108582 A1 Jun. 10, 2004

(30) Foreign Application Priority Data

Dec. 6, 2002 (KR) .................. 10-2002-0077262

(51) Int. Cl.[7] .................... B31F 5/00; B32B 31/00; B65H 29/00
(52) U.S. Cl. ........................ 156/556; 156/578
(58) Field of Search ................. 156/556, 578

(56) References Cited

U.S. PATENT DOCUMENTS

| 4,960,485 | A | * | 10/1990 | Ichinose et al. | ............ | 156/556 |
| 5,871,610 | A | * | 2/1999 | Minohoshi et al. | ......... | 156/362 |
| 6,080,931 | A | | 6/2000 | Park et al. | | |
| 6,188,127 | B1 | | 2/2001 | Senba et al. | | |
| 6,223,800 | B1 | * | 5/2001 | Kim et al. | .................. | 156/556 |
| 6,742,561 | B2 | * | 6/2004 | Nam et al. | .................. | 156/521 |

FOREIGN PATENT DOCUMENTS

| JP | 05-283608 | 10/1993 |
| JP | 08-070079 | 3/1996 |
| JP | 08-279591 | 10/1996 |
| JP | 2001-028422 | 1/2001 |
| JP | 2001-185651 | 7/2001 |

OTHER PUBLICATIONS

English language of Abstract for Japanese Patent Publication No. 08–070079, published Mar. 12, 1996.
English language of Abstract for Japanese Patent Publication No. 05–283608, published Oct. 29, 1993.
English language of Abstract for Japanese Patent Publication No. 2001–028422, published Jan. 30, 2001.
English language of Abstract for Japanese Patent Publication No. 2001–185651, published Jul. 6, 2001.
English language of Abstract for Japanese Patent Publication No. 08–279591, published Oct. 22, 1996.

* cited by examiner

*Primary Examiner*—Thien F Tran
(74) *Attorney, Agent, or Firm*—Marger Johnson & McCollom, P.C.

(57) ABSTRACT

An in-line die attaching and curing apparatus for a multi-chip package (MCP) comprises at least one die attaching apparatus and at least one snap-cure apparatus. In one embodiment, the die attaching apparatus comprises a loader, an index rail, a transfer gripper, a wafer loader, a chip alignment table, an adhesive applying device and an apparatus for placing a device on a chip mounting area. The die attaching apparatus further comprises a UV radiation device and a vision camera. The adhesive curing apparatus comprises a frame providing unit being provided with the chip mounting frame from the index rail, a plurality of heating zones, each having a heating means, the heating means operable to raise and/or lower the temperature condition of the heating zones, a frame discharging unit discharging the chip mounting frame, and frame transfer means transferring the chip mounting frame from the frame providing unit to the frame discharging unit through the heating zones.

19 Claims, 5 Drawing Sheets

IN-LINE DIE ATTACHING AND CURING APPARATUS FOR A MULTI-CHIP PACKAGE

RELATED APPLICATION

This application claims priority from Korean Patent Application No. 2002-77262 filed on Dec. 6, 2002, the contents of which are incorporated herein by reference in their entirety.

BACKGROUND OF THE INVENTION

1. Field of the Invention

The present invention relates to an apparatus for manufacturing a semiconductor chip package, and more particularly to an in-line die attaching and curing apparatus for a multi-chip package.

2. Description of the Related Art

With the development of semiconductor technology, and the pressing demand of users, recent trends in the electronics industry are towards minimization, light-weight construction and multi-function. To meet these demands, multi-chip packaging techniques have been introduced. Multi-chip packages (MCPs) include a plurality of semiconductor chips of the same or different type in a single package. MCPs manufactured by such techniques are more advantageous in size, weight and mounting area than one including a plurality of packaged semiconductor chips. MCPs have been employed in semiconductor business uses requiring minimization and light weight characteristics, such as in portable computers and portable telephones.

The MCPs generally use a leadframe or substrate such as a chip mounting frame. The substrate may include a printed circuit board and a circuit film.

FIG. 1 is a cross-sectional view of an example of a conventional MCP. Referring to FIG. 1, the MCP 10 has a substrate 21, a first chip 11 attached onto the substrate 21, and a second chip 13 attached onto the first chip 11. Adhesives 27 and 28 are formed between the substrate 21 and the first chip 11, and between the first chip 11 and the second chip 13, respectively. The first and second chips 11 and 13 have respective electrode pads 12 and 14 on active surfaces thereof. The first and second chips 11 and 13 are attached such that the active surfaces of the first and second chips 11 and 13 face in an upward direction. Bonding wires 17 and 18 electrically connect the respective first and second chips 11 and 13 to the substrate 21. The first and second chips 11 and 13 and bonding wires 17 and 18 are sealed within an encapsulating structure 31 in order to protect them from the external environment. The encapsulating structure 31 is made of epoxy molding compound (EMC). Solder balls 35 are attached to the bottom surface of the substrate 21 to provide an external electrical connection. Gold stud bumps 15 are joined onto the electrode pads 14, and substrate bonding pads 22 are joined onto the substrate 21.

The MCP may be generally manufactured by employing wafer sawing, die attaching and wire-bonding processes, and then by molding and ball attaching processes. The wafer sawing process may divide a wafer into individual semiconductor chips. The die attaching process may attach the individual semiconductor chips onto a substrate or onto a lower chip. The wire-bonding process may electrically connect the semiconductor chips to the substrate. The above three processes may be utilized in more than one instance during the MCP manufacturing process. The molding process may encapsulate the semiconductor chips and bonding wires with an encapsulating structure. The ball attaching process may attach an external electrical connection terminal to the substrate.

In the manufacture of the MCP, a thin wafer is required for a thin package. A dicing tape may be required to prevent damage of the chip which may occur due to the fragility of the thin wafer. Adhesive means attaching the chip onto the substrate or onto the lower chip may include an adhesive tape or epoxy resin to improve the reliability of the package. The adhesive means used should be cured by a curing process. The die attaching and curing processes should repeat once for each chip.

Before initiating a die attaching process, a wafer fabrication process creates integrated circuits on a wafer surface. A tape mounting process may attach a dicing tape, such as a UV tape, to the backside of the wafer. A wafer sawing process may divide the wafer into individual chips.

FIG. 2 is a flow diagram useful for explaining a die attaching process of a conventional MCP manufacturing process. Referring to FIG. 2, the UV tape attached to the backside of the wafer is irradiated with UV light rays in order to easily separate the chips from the UV tape (S1). An adhesive is applied to a chip mounting area of a substrate. A first chip is then attached to the chip mounting area of the substrate with the adhesive (S2). The substrate including the first chip is heated at a predetermined temperature to improve the adhesion strength of the adhesive (S3). The adhesive is then applied to an active surface of the first chip, and a second chip is attached to the first chip with the adhesive (S4). The substrate having the second chip is also heated at a predetermined temperature (S5).

Conventionally, a UV radiation apparatus, a die attaching apparatus and a curing apparatus are installed independently. The overall process proceeds discontinuously because the operation of each apparatus or each step of the process is individually conducted in an independent manner and performs for a predetermined amount of work as a single unit. Such an overall process may require substantial time for transferring materials between the individual apparatuses, as well as significant production downtime between each process. Furthermore, many materials must be cured at low temperature over a long time period. Therefore, it will take a great deal of time to perform the curing process when these materials are used. Accordingly, for the reasons set forth above, the aforementioned conventional die attaching processes have the disadvantage of requiring considerable increased time for completing their implementation.

SUMMARY OF THE INVENTION

An in-line die attaching and curing apparatus for a multi-chip package (MCP) is provided. According to one embodiment, the in-line die attaching and curing apparatus comprises at least one die attaching apparatus and at least one snap-cure apparatus. In the die attaching apparatuses, a loader is used to supply chip mounting frames to the die attaching apparatus. An index rail is used to mount chip mounting frame thereon and guide the movement of the chip mounting frame. A transfer gripper is used to transfer the chip mounting frame on the index rail. A wafer loader comprises a wafer cassette configured to contain a plurality of wafers and is used to provide the wafers in order. Each wafer includes a plurality of chips. A UV radiation device is used to irradiate the wafer using UV rays. A vision camera is used to perceive the wafer by visual inspection. A liquid adhesive applying device is used to apply a liquid adhesive to the chip mounting area of the chip mounting frame. An adhesive tape attaching device is used to attach an adhesive tape to the chip mounting area. A device for placing the chip is used to pick up the chip and place the chip on the chip mounting area.

The adhesive curing apparatus is located between the die attaching apparatuses. In the adhesive curing apparatus, a frame entry area or frame providing unit is provided with the chip mounting frame from the index rail of an adjacent die attaching apparatus. A plurality of heating zones each have a heating means to control the temperature condition thereof. A frame discharging unit is used to discharge the chip mounting frame to the index rail of another die attaching apparatus. A frame transfer means is used to transfer the chip mounting frame from the frame providing unit to the frame discharging unit through the heating zones.

According to another exemplary embodiment, the in-line die attaching and curing apparatus comprises two die attaching apparatuses and one snap-cure apparatus. The in-line die attaching and curing apparatus may further comprise a first loader and a second loader. The first loader may comprise an insert-type magazine to provide the chip mounting frame on the index rail. The second loader may comprise a stack-type magazine to provide the chip mounting frame on the index rail. The die attaching apparatus may further comprise a chip press device. The chip press device is used to press down the chip placed on the chip mounting area. The plurality of heating zones of the snap-cure apparatus comprise four heating zones operable to gradually raise the temperature and four heating zones operable to gradually lower the temperature.

BRIEF DESCRIPTION OF THE DRAWINGS

Exemplary embodiments of the present invention will be described with reference to the accompanying drawings, wherein like reference numerals designate like structural elements, and, in which.

DETAILED DESCRIPTION OF THE EXEMPLARY EMBODIMENTS

Exemplary embodiments of the present invention will be described below with reference to the accompanying drawings. It will be understood that the depicted elements may be simplified and/or merely exemplary, and may not necessarily be drawn to scale.

Figure 1:
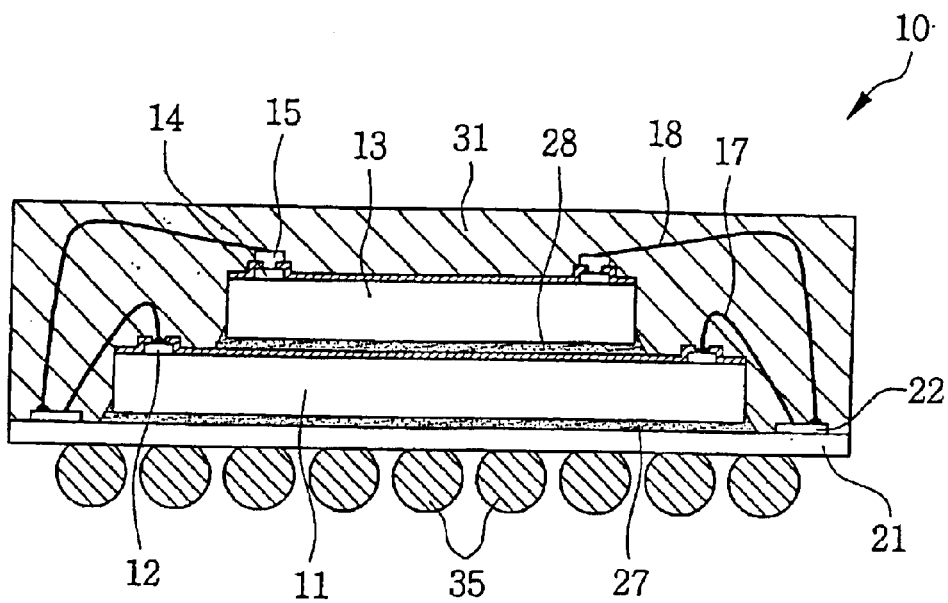
FIG. 1 is a cross-sectional view of an example of a conventional multi-chip package (MCP) using a substrate.
Figure 2:
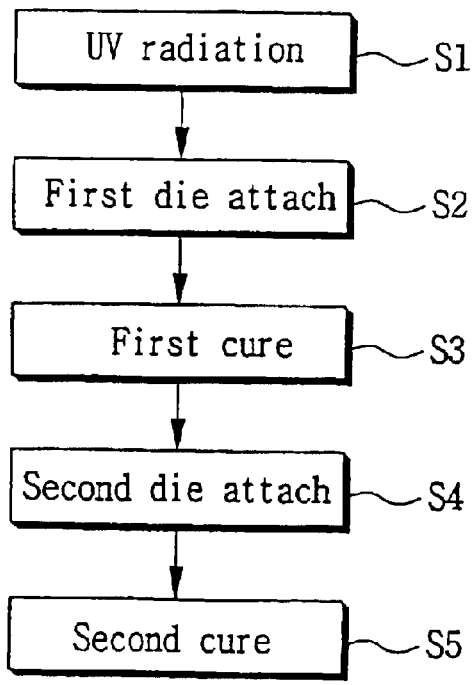
FIG. 2 is a flow diagram useful for explaining a die attaching process of a conventional multi-chip package manufacturing process.
Figure 3:
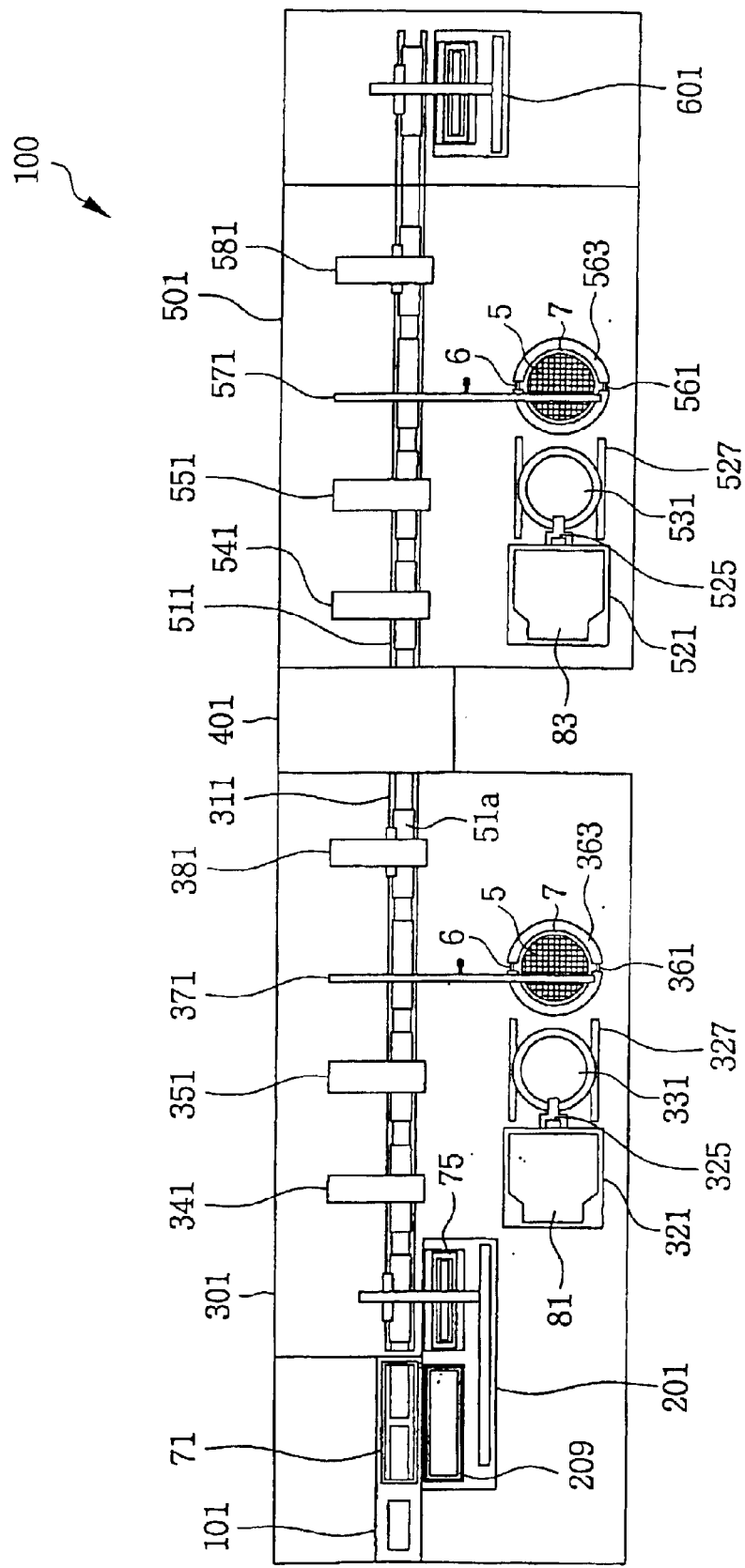
FIG. 3 is a block view of an in-line die attaching and curing apparatus in accordance with an embodiment of the present invention.

Referring to FIG. 3, an in-line die attaching and curing apparatus 100 comprises a first die attaching apparatus 301, a snap-cure apparatus 401 and a second die attaching apparatus 501. A first loader 101 is located near the first die attaching apparatus 301 and is used to provide a chip mounting frame from an insert-type magazine 71. A second loader 201 is used to provide the chip mounting frame from a stack-type magazine 75. An unloader 601 is located near the second die attaching apparatus 501.

The first and second die attaching apparatuses 301 and 501 comprises index rails 311 and 511, wafer loaders 321 and 521, UV radiation devices 331 and 531, liquid adhesive applying devices 341 and 541, adhesive tape attaching devices 351 and 551, chip alignment tables 361 and 561, pick and place devices 371 and 571 and chip press devices 381 and 581, respectively.

Figure 4:
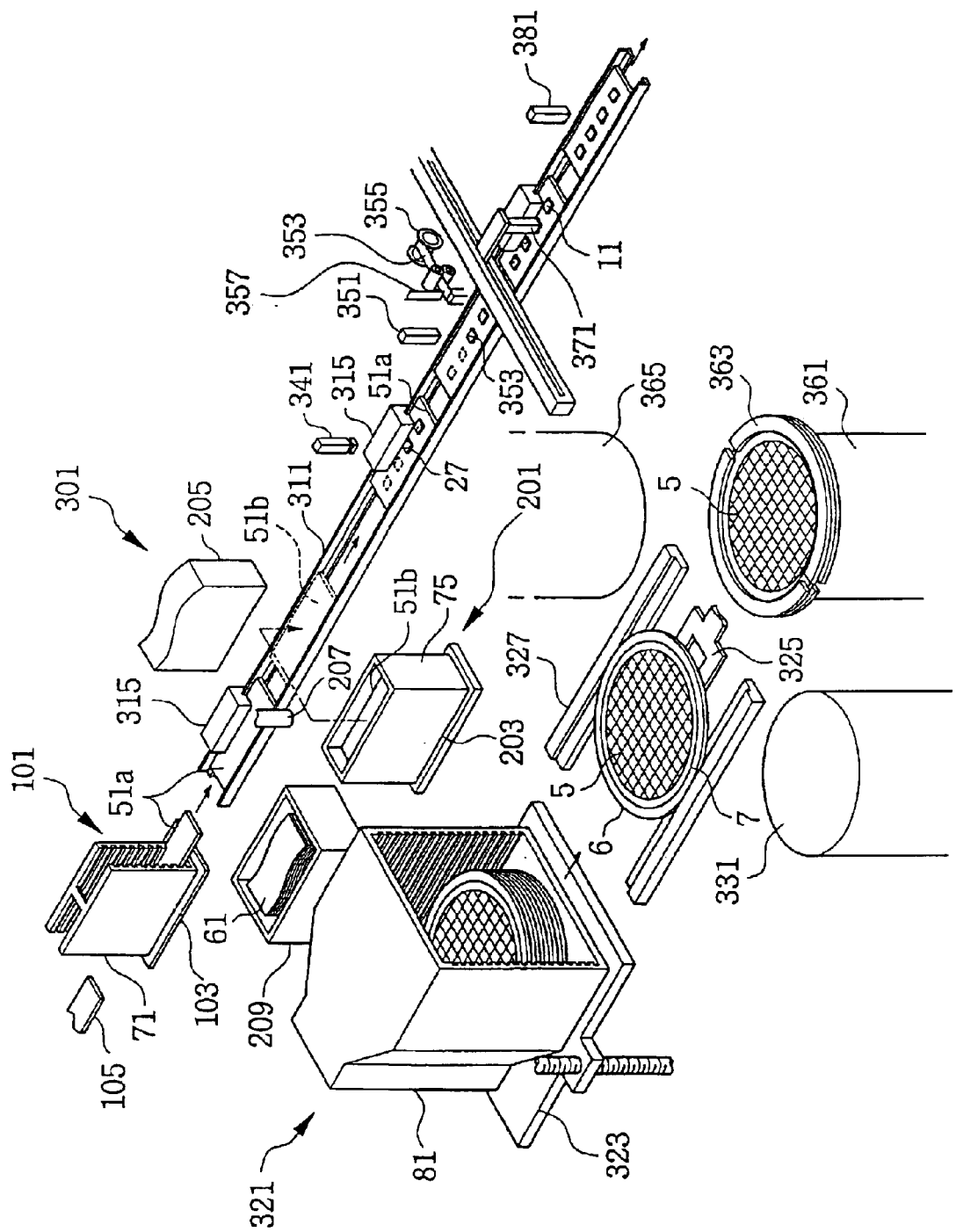
FIGS. 4 through 6 are simplified perspective views showing the in-line die attaching and curing apparatus in accordance with an embodiment of the present invention.

Referring to FIG. 4, the first loader 101 comprises a lift table 103, a pusher 105 and a driving means (not shown). The lift table 103 comprises the insert-type magazine 71 mounted thereon. The chip mounting frames 51a are inserted into different slots of the insert-type magazine 71. The pusher 105 is used to push the chip mounting frame 51a into the insert-type magazine 71. The driving means is used to lift the lift table 103 in an upward and downward direction. The chip mounting frame 51a of the insert-type magazine 71 may be a substrate such as a printed circuit board or a wiring film.

The second loader 201 comprises a loading table 203 and a picker 205. The loading table 203 comprises the stack-type magazine 75 mounted thereon. The chip mounting frames 51b are loaded in the stack-type magazine 75. The picker 205 is used to transfer the chip mounting frame 51b to an operational position by the application of vacuum force. The chip mounting frame 51b of the stack-type magazine 75 may be a leadframe. Insert papers 61 may be interposed between the respective chip mounting frames 51b. The second loader 201 may further comprise a sensor 207 to distinguish the chip mounting frames 51b from the insert papers 61. The insert papers 61 may be stored in a separate insert paper box 209.

Structures of the first and second die attaching apparatuses 301 and 501 are described below. First, the index rails 311 and 511 comprise a pair of rails located opposite to each other. The index rails 311 and 511 are used to mount the chip mounting frame 51a thereon and to guide the movement of the chip mounting frame 51a. The transfer grippers 315 and 515 are used to transfer the chip mounting frame 51a to the operational position on the index rails 311 and 511. The spacing between the index rails 311 and 511 may be dependent on the width of the chip mounting frame 51a.

The wafer loaders 321 and 521 comprise cassette elevators 323 and 523, wafer transfer arms 325 and 525 and holding rails 327 and 527. The cassette elevators 323 and 523 have wafer cassettes 81 and 83 that may contain a plurality of wafers 5. The wafers 5 are loaded into different slots of the wafer cassettes 81 and 83. The wafer 5 is supported on a wafer ring 6 using a UV tape 7. The wafer transfer arms 325 and 525 are used to discharge the wafer 5 from the wafer cassettes 81 and 83. The holding rails 327 and 527 are used to temporarily hold the wafer 5. The UV radiation devices 331 and 531 are located near the wafer loaders 321 and 521 and are used to irradiate the UV tape 7 of the wafer 5 using UV rays. The UV rays may function to weaken the adhesion strength of the tape 7. Although this embodiment shows the UV radiation devices 331 and 531 located under the holding rails 327 and 527, the UV radiation devices 331 and 531 may be located under the cassette elevators 323 and 523 if the holding rails 327 and 527 are configured to move forward and backward. In this case, when the wafer 5 is discharged from the wafer cassettes 81 and 83, the cassette elevators 323 and 523 move upward and the holding rails 327 and 527 move toward the cassette elevators 323 and 523. The wafer 5 is irradiated with UV rays by the UV radiation devices 331 and 531. Then, the holding rails 327 and 527 move backward and the cassette elevators 323 and 523 move downward. The wafer 5 is transferred to the chip alignment tables 361 and 561 by the transfer arms 325 and 525.

The chip alignment tables 361 and 561 are used to support the wafer 5 and align the chips 11 and 13. The chip alignment tables 361 and 561 are configured to move on X-axis and Y-axis according to the chip location information obtained from vision cameras 365 and 565 (to be described below). Pass or failure of the chips 11 and 13 is determined by a mapping system employing results of an electrical die sorting (EDS) process. Optionally, tape expander devices 363 and 563 are installed near the chip alignment tables 361 and 561. The tape expander devices 363 and 563 are used to pull wafer ring 6 and to expand the UV tape 7. The tape expander devices 363 and 563 may facilitate to pick up the chips 11 and 13. The tape expander devices 363 and 563 may operate selectively depending on the type of dicing tape. If a UV tape 7 is used as the dicing tape, the tape expander devices 363 and 563 may be employed. If another type of dicing tape is used, the tape expander devices 363 and 563 may not operate. The operation of the tape expander devices 363 and 563 is based on selection of mode, e.g., an expanding mode or a non-expanding mode, by an operator.

The vision cameras 365 and 565 are used to observe the chips 11 and 13 of the wafer 5 by visual inspection whereby the chip location information is obtained. The chip alignment tables 361 and 561 are configured to locate the chips 11 and 13 at the pick-up position for the pick and place devices 371 and 571 (to be described below) according to the chip location information.

The liquid adhesive applying devices 341 and 541 are used to apply the liquid adhesives 27 and 28 to the chip mounting frame 51a or chip 11. The liquid adhesive applying devices 341 and 541 may operate selectively in a script or dot mode by changing a nozzle of a syringe in the devices 341 and 541. The adhesive tape attaching devices 351 and 551 are used to attach adhesive tapes 353 and 553 to the chip mounting frame 51a or chip 11. The adhesive tapes 353 and 553 are wound on reel assemblies 355 and 555, cut at a predetermined size by tape cutters 357 and 557, and attached to the chip mounting frame 51a or chip 11. Either the liquid adhesive applying devices 341 and 541 or the adhesive tape attaching devices 351 and 551 may be used selectively depending on the adhering operation to be implemented.

The pick and place devices 371 and 571 are used to pick up specifically designated chips 11 and 13 that have been determined to be commercially acceptable. The pick and place devices 371 and 571 are further used to transfer and attach the chips 11 and 13 to the chip mounting area or the active surface of the first chip 11. The chips 11 and 13 have been determined to meet the standards of the EDS process and are placed on the chip alignment tables 361 and 561. The chip alignment tables 361 and 561 are moved along their X-axis and/or Y-axis and are positioned using vision cameras 365 and 565 so that the chips 11 and 13 can be accurately located at the pick-up position.

The chip press devices 381 and 581 are used to compress the chips 11 and 13 at a predetermined force in order to improve the adhesion strength between the chip mounting frame 51a and the chip 11 or between the chip 11 and the chip 13.

Figure 5:
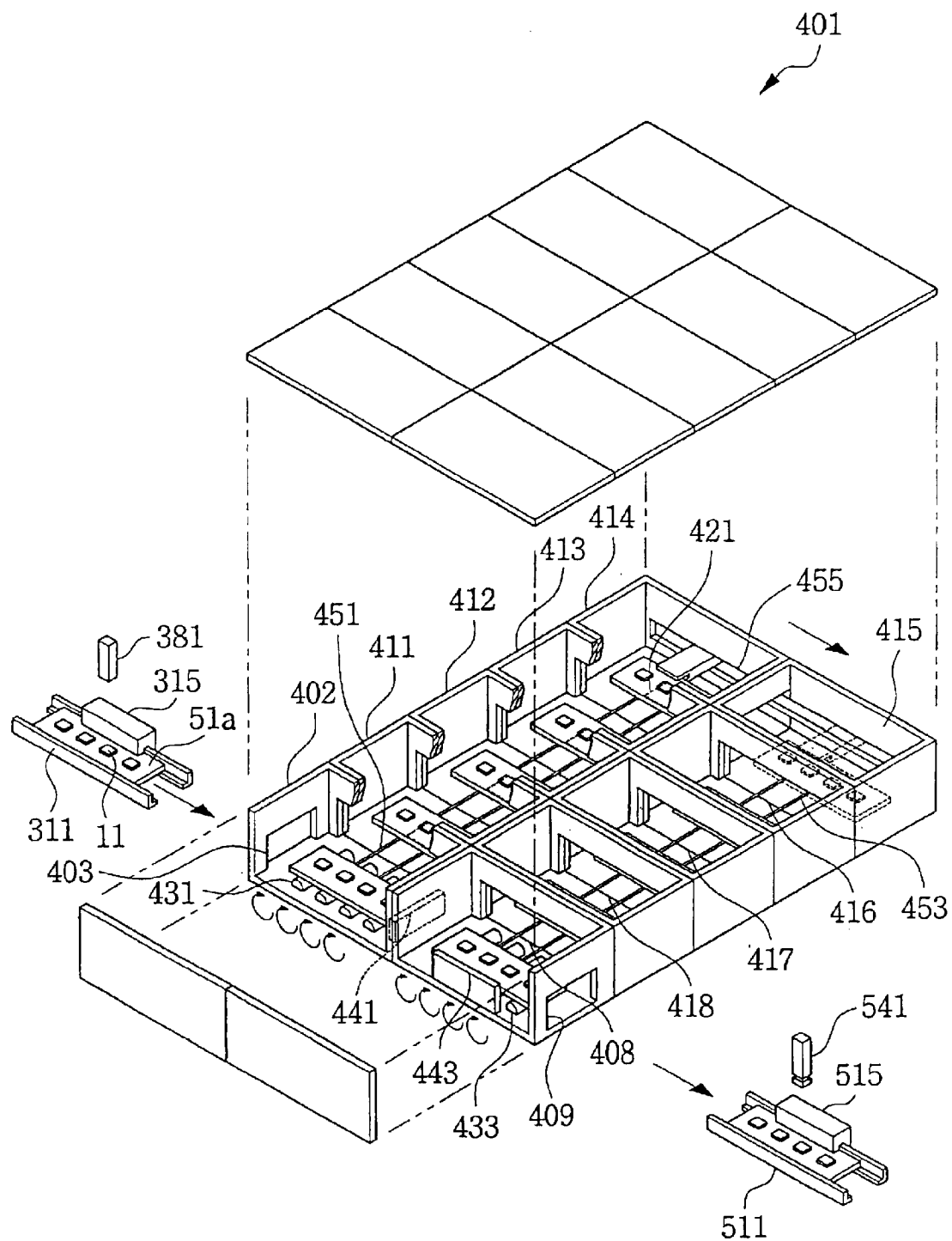
Figure 6:
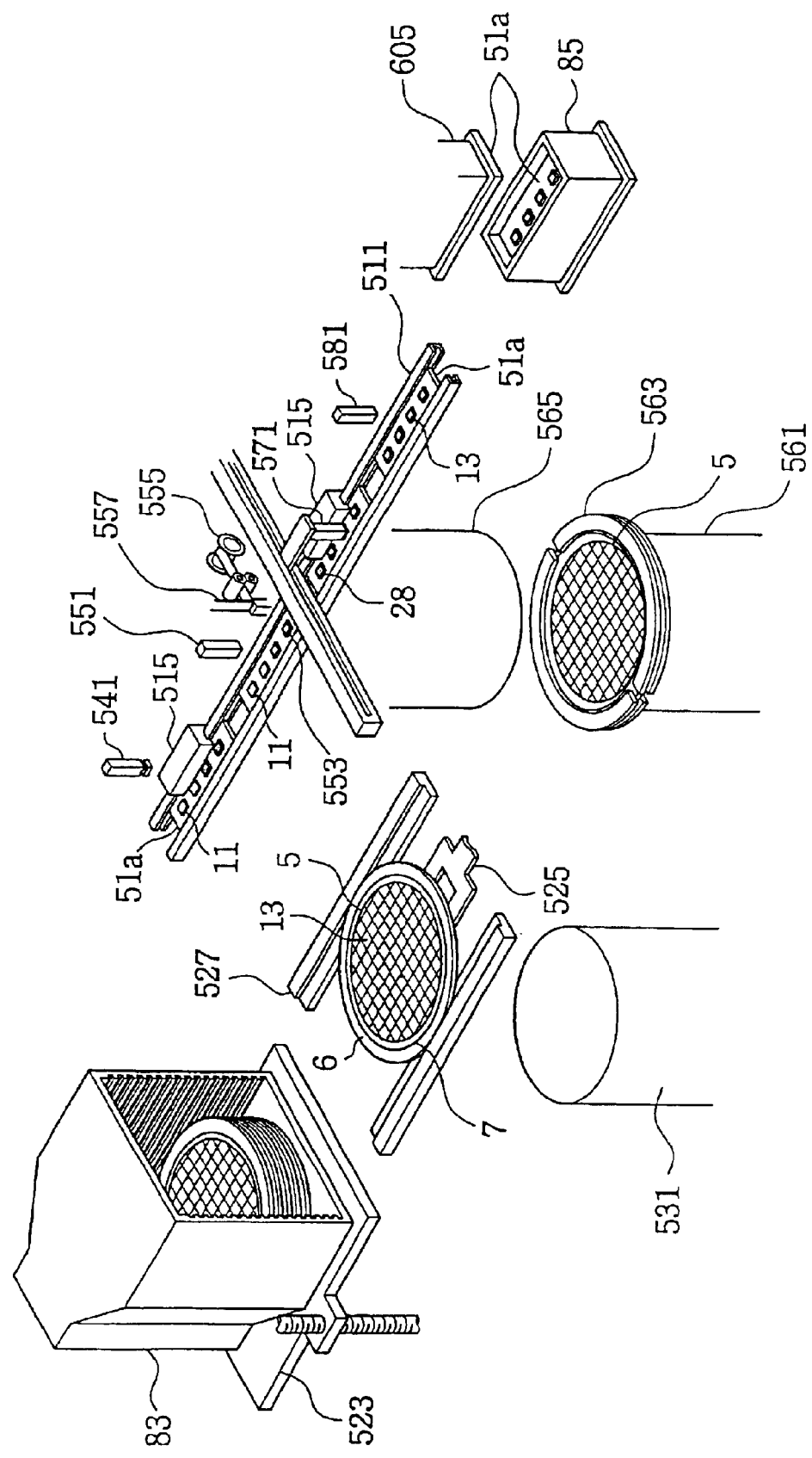

Referring to FIGS. 5 and 6, the connection of the snap-cure apparatus 401 to the first and second die attaching apparatuses 301 and 501 is described below.

The snap-cure apparatus 401 comprises heating zones 411–418, a frame entry area or frame providing unit 402 and a frame exit area or a frame discharging unit 408. The heating zones 411–418 each include a heating means 421. The heating means 421 allows for independent temperature in each of the heating zones 411–418, and is controlled to selectively raise and lower the temperature of the chip mounting frame 51a.

The frame entry area 402 and the frame exit area 408 comprise a plurality of rollers 431 and 433 and stoppers 441 and 443. The rollers may be coupled to driving means such as a motor. The stoppers 441 and 443 are located at the end of the flow path of the chip mounting frame 51a within the apparatus 401. The frame entry area 402 is provided with the chip mounting frame 51a transferred from the index rail 311 of the first die attaching apparatus 301. The frame exit area 408 is used to discharge the cured chip mounting frame 51a to the index rail 511 of the second die attaching apparatus 501. The chip mounting frame 51a is placed on the roller 431 by the transfer gripper 315 of the first die attaching apparatus 301 and reaches the stopper 441 by rotation of the roller 431. The snap-cure apparatus 401 may further comprise conveyor belts 451 and 453 and a row transfer gripper 455. The conveyor belts 451 and 453 are used to convey the chip mounting frame 51a from the frame entry area 402 to the frame exit area 408 through the heating zones 411–418. The row transfer gripper 455 is used to transfer the chip mounting frame 51a from the heating zone 414 to the heating zone 415.

The unloader 601 (FIG. 3) is used to pick up the chip mounting frame 51a from the index rail 511 of the second die attaching apparatus 501 and place the chip mounting frame 51a into a magazine 85. The chip mounting frames 51a contained in the magazine 85 are moved to a separate curing apparatus and pass through a second curing process. A heater block (not shown) may be installed at the chip attaching position of the index rails 311 and 511 to maintain the temperature of the chips 11 and 13 for good adhesion.

The operation of the in-line die attaching and curing apparatus for a multi-chip package is described below.

Substrate or Leadframe Loading

A plurality of chip mounting frames 51a are loaded in a magazine 71 of a first loader 101. A plurality of chip mounting frames 51b are loaded in a magazine 75 of a second loader 201. The chip mounting frames 51a and 51b are then provided onto an index rail 311 of a first die attaching apparatus 301 one by one. In case of the first loader 101, the magazine may be an insert-type magazine 71 receiving a substrate as the chip mounting frame 51a. In case of the second loader 201, the magazine may be a stack-type magazine 75 receiving a leadframe as the chip mounting frame 51b. The first and second loaders 101 and 201 may be provided selectively depending on the load type of the chip mounting frame 51a and 51b to be provided. If the first loader 101 is provided, a lift table 103 moves upward and a pusher 105 pushes the chip mounting frames 51a towards the index rail 311 one by one. The chip mounting frame 51a is transferred to the operational position by a transfer gripper 315. Alternatively, if the second loader 201 is provided, a sensing camera 207 distinguishes the chip mounting frame 51b from an insert paper 61. The chip mounting frame 51b is transferred to the index rail 311. The insert paper 61 is transferred to an insert paper box 209. The use of the receiving magazine 71 is hereinafter set forth in the description.

Adhesive Applying or Adhesive Tape Attaching

When the chip mounting frame 51a is loaded in the index rail 311, a liquid adhesive 27, e.g., an epoxy resin adhesive, is applied to the chip mounting area of the chip mounting frame 51a by an adhesive applying device 341 in a dot or script mode. Alternatively, adhesive tape 353 may be applied by an adhesive tape attaching device 351. The adhesive tape 353 is wound on a reel assembly 355 and cut at a predetermined size by a tape cutter 357. The adhesive tape 353 is attached to the chip mounting area. The adhesive applying device 341 and adhesive tape attaching device 351 may be operated selectively depending on the product type. The use of the liquid adhesive 27 is hereinafter set forth in the description.

Wafer Loading

A wafer 5 is contained in a wafer cassette 81 mounted on a wafer loader 321 and transferred to a holding rail 327 by a wafer transfer arm 325. A UV radiation device 331 irradiates UV rays to the wafer 5. A dicing UV tape 7 attached to the backside of the wafer 5 is irradiated with UV rays. The wafer 5 is transferred to a chip alignment table 361. A tape expander device 363 pulls a wafer ring 6 to increase the spacing between the chips 11 of the wafer 5. A vision camera 365 identifies the location of the chip 11 which has been determined to be acceptable. If the location of chip 11 deviates from the correct pick-up position, the chip alignment table 361 moves along its X-axis and/or Y-axis and adjusts the location of the chip 11. The commercial acceptability of the chip 11 is determined by a mapping system using an EDS process.

First Die Attach

The chip 11 is located at a pick-up position on the chip alignment table 361. A pick and place device 371 picks up the chip 11 and places the chip 11 on the chip mounting area of the chip mounting frame 51a. The first die attaching step is performed on the chip mounting frames 51a one by one.

First Press

When the chip 11 is attached on the chip mounting frame 51a, a chip press device 381 compresses the chip 11 to improve the adhesion strength between the chip mounting frame 51a and the chip 11. A heater block (not shown) may be installed to emit heat to the chip mounting frame 51a to promote good attachment.

First Cure

The chip mounting frame 51a is moved to the snap-cure apparatus 401. The chip mounting frame 51a enters a frame entry area 402 through an entrance port 403 by the transfer gripper 315 of the first die attaching apparatus 301. The chip mounting frame 51a reaches the inside of the frame entry area 402 by rotation of a roller 431. The movement of the chip mounting frame 51a is stopped by a stopper 441.

The chip mounting frame 51a is cured while passing through four heating zones 411–414 along a conveyor belt 451. The chip mounting frame 51a is moved from the heating zone 414 to the heating zone 415 by a row transfer gripper 455. The chip mounting frame 51a is cured while passing through another four heating zones 415–418. The chip mounting frame 51a reaches a stopper 443 after the heating zone 418. The chip mounting frame 51a is placed on an index rail 511 of a second die attaching apparatus 501 by rotation of a roller 433. The chip mounting frame 51a is transferred to the next operation location by a transfer gripper 515 of the second die attaching apparatus 501. The temperature of the heating zones 411–418 is controllable independently by the operator of the apparatus 100.

Adhesive Applying or Adhesive Tape Attaching

When the chip mounting frame 51a is provided in the index rail 511 of the second die attaching apparatus 501, the adhesive applying device 541 or adhesive tape attaching device 551 may be operated selectively in the same manner as with the first die attaching apparatus 301. Either a liquid adhesive 28 or adhesive tape 553 may be attached on the first chip 11. The use of the liquid adhesive 28 is hereinafter set forth in the description.

Second Wafer Loading

As in the first die attaching apparatus 301, a wafer 5 including chips 13 is contained in a wafer cassette 83 mounted on a wafer loader 521 and transferred to a holding rail 527 by a wafer transfer arm 525. The wafer 5 is irradiated with UV rays by a UV radiation device 531. A dicing UV tape 7 attached to the backside of the wafer 5 is irradiated. The wafer 5 is transferred to a chip alignment table 561 of the second die attaching apparatus 501. A tape expander device 563 pulls the wafer ring 6 to increase the spacing between the chips 13. A vision camera 565 identifies the location of the chip 13. If the second chip 13 deviates from the correct pick-up position, the chip alignment table 561 adjusts the location of the second chip 13.

Second Die Attach

The second chip 13 is located at a pick-up position on the chip alignment table 561. A pick and place device 571 picks up the second chip 13 with vacuum force and places the second chip 13 on the chip mounting area of the chip mounting frame 51a. The second chip 13 is attached on the first chip 11 having the liquid adhesive 28. This operation proceeds for the chip mounting frame 51a on a one by one basis.

Second Press

When the second chip 13 is attached on the first chip 11, the second chip 13 is compressed by a chip press device 581 of the second die attaching apparatus 501. This improves the adhesion strength between the first chip 11 and the second chip 13.

Unloading

The chip mounting frame 51a including the first and second chips 11 and 13 is transferred to the magazine 85 by a picker 605 of an unloader 601 under vacuum. The chip mounting frame 51a is then transferred to a separate curing apparatus and is cured.

In accordance with the embodiment of the present invention, the in-line die attaching and curing apparatus may comprise two die attaching apparatuses and one snap-cure apparatus installed between the die attaching apparatuses. The die attaching apparatus may include a UV radiation device. The in-line die attaching and curing apparatus may further comprise a first loader and a second loader. The in-line die attaching and curing apparatus may further comprise an adhesive applying device and an adhesive tape attaching device.

The chip mounting frame may be transferred from the first die attaching apparatus to the second die attaching apparatus through the curing apparatus in a continuous manner. This may eliminate the operation of transferring the materials to each apparatus and the need of waiting for the availability of the next procedure. Specifically, because the UV radiation device is included in the die attaching apparatus, the present invention may eliminate the operation of loading/unloading the wafer from/to a wafer cassette for a separate radiation and therefore may eliminate the time required in transferring the materials from the UV radiation device to the first die attaching apparatus. Further, the time limit to the condition of a dicing UV tape irradiated with UV rays may be reduced. Practically, the present invention may reduce 50% or more of the required time, compared with the conventional art.

The present invention may comprise both the first loader and the second loader to use both the substrate and leadframe. The present invention may comprise both the liquid adhesive applying device and the adhesive tape attaching device to use both the liquid adhesive and the adhesive tape. This may eliminate a need for accommodating a new facility or modifying the facility depending on the type of the chip mounting frame or adhesive means.

Further, the number of the loaders and unloaders may be reduced.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims. For example, although the preferred embodiment of the present invention shows an in-line die attaching and curing apparatus for a multi-chip package having two semiconductor chips, it is possible to manufacture a multi-chip package having a plurality of semiconductor chips if the curing apparatus may be installed between as many of the die attaching apparatuses as the stacked semiconductor chips.

What is claimed is:

1. An in-line die attaching and curing apparatus for producing a multi-chip package (MCP), comprising:
    at least one die attaching apparatus including:
        an apparatus for supplying chip mounting frames;
        an apparatus for guiding the movement of the chip mounting frame;
        an apparatus for transferring the chip mounting frame onto the guiding apparatus;
        an apparatus for providing wafers including a plurality of chips;
        an apparatus for applying an adhesive to a chip mounting area of the chip mounting frame; and
        a device for placing at least one of the plurality of the chips onto the chip mounting area; and
    at least one adhesive curing apparatus including:
        an apparatus including a plurality of adhesive curing zones for raising and lowering the curing temperature; and
        an apparatus for transferring the chip mounting frame through the adhesive curing zones apparatus.

2. The apparatus of claim 1, wherein the heating zones apparatus includes a frame providing unit for providing the chip mounting frame thereto from the chip mounting frame guiding apparatus.

3. The apparatus of claim 1, wherein the heating zones apparatus includes a frame discharging unit for discharging the chip mounting frame.

4. The apparatus of claim 1, wherein apparatus for transferring the chip mounting frame comprises a transfer gripper apparatus.

5. The apparatus of claim 1, wherein the chip mounting frames are supplied from an insert-type magazine or a stack-type magazine.

6. The apparatus of claim 1, wherein the guiding apparatus comprises an index rail.

7. The apparatus of claim 1, wherein each die attaching apparatus further include a chip press device for compressing the chip during the adhesive curing thereof.

8. The apparatus of claim 1, wherein the adhesive curing apparatus includes adhesive curing units for heating and adhesive curing units for cooling the chip on the chip mounting area.

9. The apparatus of claim 1, wherein each die attaching apparatus further includes a UV radiation device for irradiating the wafer with UV rays.

10. The apparatus of claim 1, wherein each die attaching apparatus further includes a camera for observing the wafer by visual inspection.

11. The apparatus of claim 1, wherein the apparatus for applying adhesive is a liquid adhesive applying device applying a liquid adhesive to the chip mounting area of the chip mounting frame.

12. The apparatus of claim 1, wherein the apparatus for applying adhesive is an adhesive tape attaching device attaching an adhesive tape to the chip mounting area of the chip mounting frame.

13. The apparatus of claim 1, wherein the apparatus for supplying chip mounting frames is a loader.

14. The apparatus of claim 1, wherein the apparatus for providing wafers is a wafer loader.

15. The apparatus of claim 1, wherein the device for placing the chip on the chip mounting area is a pick and place device.

16. The apparatus of claim 1, further comprising a chip alignment table supporting the wafer.

17. The apparatus of claim 1, further comprising an unloader for transferring the chip mounting frame to a magazine.

18. The apparatus of claim 1, which further includes at least two die attaching apparatuses.

19. The apparatus of claim 18, which said adhesive curing apparatus is located between at least two die attaching apparatuses.

* * * * *